(12) United States Patent
Dausch et al.

(10) Patent No.: US 6,586,738 B2
(45) Date of Patent: Jul. 1, 2003

(54) ELECTROMAGNETIC RADIATION DETECTORS HAVING A MICROMACHINED ELECTROSTATIC CHOPPER DEVICE

(75) Inventors: David E. Dausch, Raleigh, NC (US); Gary E. McGuire, Carrboro, NC (US)

(73) Assignee: MCNC, Research Triangle Park, NC (US)

( * ) Notice: Subject to any disclaimer, the term of this patent is extended or adjusted under 35 U.S.C. 154(b) by 122 days.

(21) Appl. No.: 09/834,825

(22) Filed: Apr. 13, 2001

(65) Prior Publication Data

US 2002/0148964 A1 Oct. 17, 2002

(51) Int. Cl.[7] .................................................. G01J 5/00
(52) U.S. Cl. ..................... 250/338.3; 250/351; 250/350
(58) Field of Search .............................. 250/338.3, 350, 250/351

(56) References Cited

U.S. PATENT DOCUMENTS

| | | |
|---|---|---|
| 3,471,641 A | 10/1969 | Baker et al. |
| 3,772,537 A | 11/1973 | Clifford et al. |
| 3,897,997 A | 8/1975 | Kalt |
| 3,917,196 A | 11/1975 | Pond et al. |
| 3,989,357 A | 11/1976 | Kalt |
| 4,025,193 A | 5/1977 | Pond et al. |
| 4,073,567 A | 2/1978 | Lakerveld et al. |
| 4,094,590 A | 6/1978 | Kalt |
| 4,105,294 A | 8/1978 | Peck |
| 4,143,946 A | 3/1979 | Leo et al. |

(List continued on next page.)

FOREIGN PATENT DOCUMENTS

| | | |
|---|---|---|
| DE | 3230159 C1 | 4/1983 |
| DE | 4235593 A | 10/1992 |
| EP | 0 834 759 A2 | 4/1998 |
| WO | WO 95/23352 A1 | 8/1995 |

OTHER PUBLICATIONS

Kurt E. Petersen, "Silicon Torsional Scanning Mirror," *IBM J. Res. Develop.* Sep. 1980, pp. 631–637, vol. 25 No. 5, San Jose, California.

M. Elwenspoet et al., "Active joints for microrobot limbs," *J. Micromech. microeng*, 1992, pp. 221–223, IOP Publishing Ltd., United Kingdom.

V.P. Jaecklin et al. "Optical Microshutters and Torsional Micromirrors For Light Modulator Arrays," *IEEE*, 1993, pp. 124–127.

(List continued on next page.)

*Primary Examiner*—David Porta
*Assistant Examiner*—Troy A Berchem
(74) *Attorney, Agent, or Firm*—Alston & Bird LLP (57) ABSTRACT

The present invention provides for an improved electromagnetic radiation detector having a micromachined electrostatic chopping device. The MEMS flexible film chopping device provides reliability, efficiency, noise reduction and temperature fluctuation compensation capabilities to the associated electromagnetic radiation detector. An electromagnetic radiation detector having an electrostatic chopper device comprises a detector material element, first and second electrodes in electrical contact with the detector material element and electrically isolated from one another. Additionally, the chopper device will incorporate a flexible film actuator overlying the detector material layer and moveable relative thereto. The flexible film actuator will typically include an electrode element and a biasing element such that the actuator remains in a fully curled, open state absent electrostatic voltage and moves to a fully uncurled, closed state upon the application of electrostatic voltage. Arrays that incorporate a plurality of electromagnetic radiation detectors and/or electrostatic chopping devices are additionally provided for.

46 Claims, 9 Drawing Sheets

U.S. PATENT DOCUMENTS

| | | | |
|---|---|---|---|
| 4,230,393 A | | 10/1980 | Burke, Jr. |
| 4,235,522 A | | 11/1980 | Simpson et al. |
| 4,248,501 A | | 2/1981 | Simpson |
| 4,266,339 A | | 5/1981 | Kalt |
| 4,317,611 A | | 3/1982 | Petersen |
| 4,336,536 A | | 6/1982 | Kalt et al. |
| 4,361,911 A | | 11/1982 | Buser et al. |
| 4,468,663 A | | 8/1984 | Kalt |
| 4,517,569 A | | 5/1985 | Gerharz |
| 4,564,836 A | | 1/1986 | Vuilleumier et al. |
| 4,618,223 A | | 10/1986 | Fried |
| 4,662,746 A | | 5/1987 | Hornbeck |
| 4,695,837 A | | 9/1987 | Kalt |
| 4,708,420 A | | 11/1987 | Liddiard |
| 4,710,732 A | | 12/1987 | Hornbeck |
| 4,732,440 A | | 3/1988 | Gadhok |
| 4,736,202 A | | 4/1988 | Simpson et al. |
| 4,762,426 A | | 8/1988 | Foss |
| 5,061,049 A | | 10/1991 | Hornbeck |
| 5,083,857 A | | 1/1992 | Hornbeck |
| 5,097,354 A | | 3/1992 | Goto |
| 5,172,262 A | | 12/1992 | Hornbeck |
| 5,202,785 A | | 4/1993 | Nelson |
| 5,212,582 A | | 5/1993 | Nelson |
| 5,233,459 A | | 8/1993 | Bozler et al. |
| 5,274,379 A | | 12/1993 | Carbonneau et al. |
| 5,311,360 A | | 5/1994 | Bloom et al. |
| 5,408,355 A | | 4/1995 | Rauch et al. |
| 5,552,925 A | | 9/1996 | Worley |
| 5,568,307 A | | 10/1996 | Williams |
| 5,589,687 A | * | 12/1996 | Kawata et al. ............ 250/338.3 |
| 5,606,447 A | | 2/1997 | Asada et al. |
| 5,629,790 A | | 5/1997 | Neukermans et al. |
| 5,629,918 A | | 5/1997 | Ho et al. |
| 5,661,592 A | | 8/1997 | Bornstein et al. |
| 5,673,139 A | | 9/1997 | Johnson |
| 5,681,103 A | | 10/1997 | Remillard et al. |
| 5,757,562 A | | 5/1998 | Apollonov et al. |
| 5,867,302 A | | 2/1999 | Fleming |
| 5,903,078 A | | 5/1999 | Sakamoto et al. |
| 5,949,071 A | * | 9/1999 | Ruffner et al. ............ 250/338.3 |
| 6,057,814 A | * | 5/2000 | Kalt ............................. 345/58 |
| 6,067,183 A | | 5/2000 | Furlani et al. |
| 6,069,359 A | * | 5/2000 | Imada et al. ............. 250/338.3 |
| 6,175,443 B1 | | 1/2001 | Aksuyk et al. |
| 6,233,088 B1 | | 4/2001 | Scharnberg et al. |
| 6,396,620 B1 | * | 5/2002 | Goodwin-Johansson .... 359/292 |
| 6,495,828 B1 | * | 12/2002 | Tidrow et al. ............ 250/338.2 |

OTHER PUBLICATIONS

M. Elwenspoek et al. "Static and Dynamic Properties of Active Joints," *Transducers '95–Eurosensors IX, The $8^{th}$ International Conference on Solid–State Sensors and Actuators, and Eurosensors IX*, Jun. 25–29, 1995, pp. 412–415, Stockholm, Sweden.

Rob Legtenberg et al., "Electrostatic Curved Electrode Actuators," *IIEE*, pp. 37–42, Catalog No. 95CH35754.

Devis Gunawan et al., "Micromachined corner cube reflectors as a communication link," *Sensors and Actuators*, 1995, pp. 580–583, Nos. 1/3, Lausanne, CH.

M. Edward Montamedi et al., "Development of micro–electro–mechanical optical scanner," *Optical. Engineering*, May 1997, pp. 1347–1352, vol. 36, No. 5.

J. Haji–Babaer et al. "Integrable Active Microvalve With Surface Micromachined Curled–Up Actuator," *IIEE*, 1997, pp. 833–836, 1997 International Conference o n Solid State Sensors and Actuators, Chicago, Jun. 16–19, 1997.

Behrang Behin, et al. "Magnetically Actuated Micromirrors for Fiber–Optic Switching," *Solid–State Sensors and Actuator Workshop* Jun. 8–11, 1998, pp. 273–276, Hilton Head Island, South Carolina.

K. Deng, et al. "The Development of Polysilicon Micromotors for Optical Scanning Applications," *Paper, Electronics Design Center, Department of Electrical Engineering and Applied Physics, Case Western Reserve University, Cleveland, Ohio*, 5 pages.

Hiroshi Goto et al. "Scanning Optical Sensor for Micro Robot," *Paper, Central R&D Laboratory, OMRON Corporation*, 6 pages.

V.P. Jaecklin et al., "Mechanical and Optical Properties of Surface Micromachined Torsional Mirrors in Silicon, Polysilicon and Aluminum," *The $7^{th}$ International Conference on Solid–State Sensors and Actuators*, pp. 958–961.

* cited by examiner

ELECTROMAGNETIC RADIATION DETECTORS HAVING A MICROMACHINED ELECTROSTATIC CHOPPER DEVICE

FIELD OF THE INVENTION

The present invention relates to microelectromechanical actuator structures, and more particularly to an electromagnetic radiation chopper device used in conjunction with an associated electromagnetic radiation detector.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully been used to controllably move micromachined structures. Controlled thermal expansion of actuators or other MEMS components has been used to create forces for driving microdevices.

Various MEMS devices have been developed that implement electrostatic force to move structures. Traditional electrostatic devices were constructed from laminated films cut from plastic or mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,339, entitled "Method for Making Rolling Electrode for Electrostatic Device", issued on May 12, 1981, in the name of inventor Kalt. These type of devices work well for typical motive applications, but these devices cannot be constructed in dimensions suitable for miniaturized integrated circuits, biomedical applications, or MEMS structures.

Micromachined MEMS devices have also utilized electrostatic forces to move microstructures. Some MEMS electrostatic devices use relatively rigid cantilever members, as found in U.S. Pat. No. 5,578,976, entitled Micro Electromechanical RF Switch", issued on Nov. 26, 1996 in the name of inventor Yao. These types of cantilevered actuators fail to A disclose flexible electrostatic actuators with a radius of curvature oriented away from the substrate surface. Other MEMS devices disclose curved electrostatic actuators; however, some of these devices incorporate complex geometries using relatively difficult microfabrication techniques.

Recent developments have led to simplified MEMS devices that utilize electrostatic forces to move structures. These devices, which are based on flexible membranes that embody electrodes, provide for ease in fabrication and can be processed using conventional MEMS fabrication techniques. See for example, U.S. Pat. No. 6,057,520, entitled "Arc Resistant High Voltage Micromachined Electrostatic Switch", issued on May 2, 2000, in the name of inventor Goodwin-Johansson. The Goodwin-Johansson '520 patent is herein incorporated by reference as if set forth fully herein. By modifying the biasing capabilities of the flexible film actuator disclosed in the Goodwin-Johansson '520 patent it is possible to fabricate actuators having a radius of curvature such that the actuator will fully curl prior to applying electrostatic voltage and fully uncurl upon the application of electrostatic voltage.

Current electromagnetic radiation imaging devices, typically infrared (IR) imaging devices, such as night vision devices, forward looking infrared devices (FLIRs) and the like, implement mechanical chopper wheels as the means by which radiation signals are pulsed for submission to the detectors/pixels. These chopping mechanisms are necessary for imaging device detectors to modulate or chop the incident electromagnetic radiation. The need for chopping of the signal is especially apparent in pyroelectric detectors since electrical charge is generated in the pyroelectric material by a change in temperature. The change in polarization of the pyroelectric material is defined in terms of the temperature change as:

$$\Delta P_i = p_i \Delta T$$

where $\Delta P_i$ is a change in polarization, $p_i$ is the pyroelectric coefficient and $\Delta T$ is the temperature change that the pyroelectric film detects corresponding to changes in the incident radiation.

Signal chopping is also beneficial for other electromagnetic radiation detector systems, preferably infrared detector systems, such as thermal bolometers that produce a change in resistance with temperature. The resistance change in a thermal bolometer is a direct current effect, versus the pyroelectric detector which is an alternating current effect, so a chopper device is not necessarily required for a bolometer detector. However, for systems needing high sensitivity, signal chopping is needed to periodically modulate the signal to prevent thermal drift and signal noise such that high sensitivities can be achieved.

The typical mechanical chopper wheel that is currently used in such imaging devices tend to be bulky in size (e.g., 1 to 4 inch diameter wheels made of patterned germanium or machined metal), consume significant electrical power and are typically constructed separate from the associated detectors and pixels. In addition, chopper wheels are potentially unreliable and inefficient in modulating the electromagnetic radiation signals. Additionally, since the chopping wheel will typically be responsible for chopping an entire focal plane array of detectors/pixels, if the chopping wheel fails, the entire FPA of detectors is rendered inoperable.

A need exists to develop a chopping device for electromagnetic radiation signal detection that is simple in design and fabrication, consumes less space and electrical power in the detector system, and is more reliable and efficient than current devices. By incorporating MEMS technology, and more specifically electrostatically activated flexible film actuators as chopping elements it is possible to design and fabricate a unitary structure that allows for further reduction in detector/pixel size as advances in the field of IR imaging devices occur. The electrostatic activation of such a device would provide significant size reduction and consume much less power compared with the typical chopping wheel and associated drive motor. Power consumed by the electrostatically activated MEMS chopper is about 2 mW at 100 Hz compared with a chopper wheel motor which consumes several Watts of power.

Additionally, such a device would provide for individual chopping elements (i.e., actuators) to be associated with an individual detector/pixel or, alternatively, a parsed portion of the overall FPA. This would allow the IR FPA to remain operational if only a single chopper element was to fail. In the same regard, it would be possible to close off individual detectors/pixels or small subsets of detectors/pixels could be closed while the remainder of detectors/pixels remain open. In this instance, the closed pixels could then be referenced as the background temperature to subtract out possible noise or temperature fluctuations occurring in the FPA. As such this would provide for a means of noise reduction and compensation for temperature fluctuations in the radiation detector. Current chopping wheel mechanisms are incapable of providing such noise reduction and/or temperature fluctuation compensation. In a similar fashion, if temperature spikes in the array result in "hot spots" (i.e. an area of constant brightness) this area could be closed independent of the remaining detector/pixels to zero out the temperature spike. Localized detectivity could also be controlled by operating subsections of the FPA at a different chopping frequency. Lower chopping frequency could be used for areas of the image requiring higher sensitivity, and higher frequency could be used for faster image scan rates for less sensitive areas. Specific detectivity of IR detectors is known to be dependent on chopping frequency.

As such a need exists to develop an improved electromagnetic radiation chopping device, specifically an electrostatically activated MEMS device that will leverage the simplified MEMS fabrication techniques with the advantages of individual chopper/actuator design. Such a design will additionally provide signal noise reduction, sensitivity modulation, compensation for temperature fluctuations and temperature referencing capabilities.

SUMMARY OF THE INVENTION

The present invention provides for an improved electromagnetic radiation detector having an electrostatic chopping device and associated arrays incorporating a plurality of detectors and/or chopping devices. An electrostatically activated MEMS chopping device is provided that provides reliability, efficiency, noise reduction and temperature fluctuation compensation capabilities to the associated electromagnetic radiation detectors.

An electromagnetic radiation detector having an electrostatic MEMS chopping device according to the present invention comprises a detector material element, typically a pyroelectric or bolometer material element, and first and second electrodes in electrical contact with the detector material element and electrically isolated from one another. Additionally, the chopper device will incorporate a flexible film actuator overlying the detector material layer and moveable relative thereto. The flexible film actuator will typically include an electrode element and a biasing element such that the actuator remains in a fully curled, open state absent electrostatic voltage and moves to a fully uncurled, closed state upon the application of electrostatic voltage. Typically, the detector material element will be supported by a support surface, such as a microelectronic substrate or the like.

In one embodiment of the invention the flexible film actuator is fabricated directly on the detector or the pixels of a focal plane array having a fixed portion of the actuator attached to the underlying surface and a distal portion that is released from the underlying surface. The electrode element in the flexible film actuator and one of the electrodes associated with the detector material element interact to provide the electrostatic voltage necessary to move the flexible film actuator.

In an alternate embodiment of the invention a transparent substrate having a transparent electrode element are supported by a support structure, such as a microelectronic substrate and raised above the detector/pixel element. In this embodiment the flexible film actuator is supported by and attached to the transparent substrate. The transparent substrate and the transparent electrode are transparent to the electromagnetic radiation that is being transmitted to the detector, typically IR radiation. This embodiment of the invention reduces the effect of signal interference between the actuator drive voltage and the radiation detector output signal due to increased space between the electrodes in the flexible film actuator and the electrodes in the detector/pixel. Additionally, the transparent substrate and the resulting air gap between the transparent substrate and the detector/pixel provide for additional insulation.

In an alternate embodiment of the present invention, the electromagnetic radiation detector having an electrostatically driven MEMS chopper device is defined by a substrate, a thermal isolation bridge disposed on the substrate, a first electrode layer disposed on the thermal isolation bridge, a detector material layer overlying the thermal isolation bridge and in electrical contact with the first electrode layer and a second electrode layer overlying the thermal isolation bridge, electrically isolated from the first electrode layer and in electrical contact with the detector material layer. Additionally the detector device will comprise a flexible film actuator, serving as the chopper, overlying the detector material layer. The flexible film actuator having a third electrode layer and at least one biasing layer, the actuator having a fixed portion attached to the insulator layer and a distal portion movable with respect to the second electrode layer. The detector device may also include a radiation-absorbing layer and/or an insulator layer overlying the first and second electrode layers and the detector material layer.

In yet another embodiment of the invention the electromagnetic radiation detector having an electrostatically driven MEMS chopper device is defined by a substrate, a thermal isolation bridge disposed on the substrate, a first electrode layer disposed on the thermal isolation bridge, a detector material layer overlying the thermal isolation bridge and in electrical contact with the first electrode layer, and a second electrode layer overlying the thermal isolation bridge, electrically isolated from the first electrode layer and in electrical contact with the detector material layer. Additionally, the chopper device will include an radiation absorbing layer overlying the first and second electrode layers and the detector material layer, a support structure disposed on the substrate, a transparent substrate attached to the support structure, a transparent third electrode layer disposed on the transparent substrate; and a flexible film actuator overlying the transparent third electrode and the detector material layer. The flexible film actuator having a fourth electrode layer and at least one biasing layer, a fixed portion attached to the transparent substrate and a distal portion movable with respect to the third electrode layer.

Alternatively, the invention is embodied in an array of detectors having associated electrostatically activated chopper devices. The array includes a plurality of detector pixels, each detector pixel comprising a detector material layer and a first and second electrode in electrical contact with the detector material layer. In addition, the array includes a plurality of flexible film actuators, each actuator generally overlying the detector material layer of a corresponding detector pixel and moveable relative thereto to alternately allow passage of radiation to the detector material layer and block passage of radiation to the detector material.

A method for pixel modulation in an electromagnetic detector array is also provided for. The method comprises providing for a plurality of electrostatically activated flexible film actuators, each actuator corresponding to one or more detector pixels in an electromagnetic radiation array. Pulsing one or more flexible film actuators to block passage of electromagnetic radiation and to allow passage of electromagnetic radiation to the one or more detector pixels corresponding to the flexible film actuator. In turn, the pulsing of the actuators causes a temperature change in the one or more corresponding detector pixels. The change in temperature results in a change in an electrical property of the one or more detector pixels and, based on the property change, a read-out current is generated.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
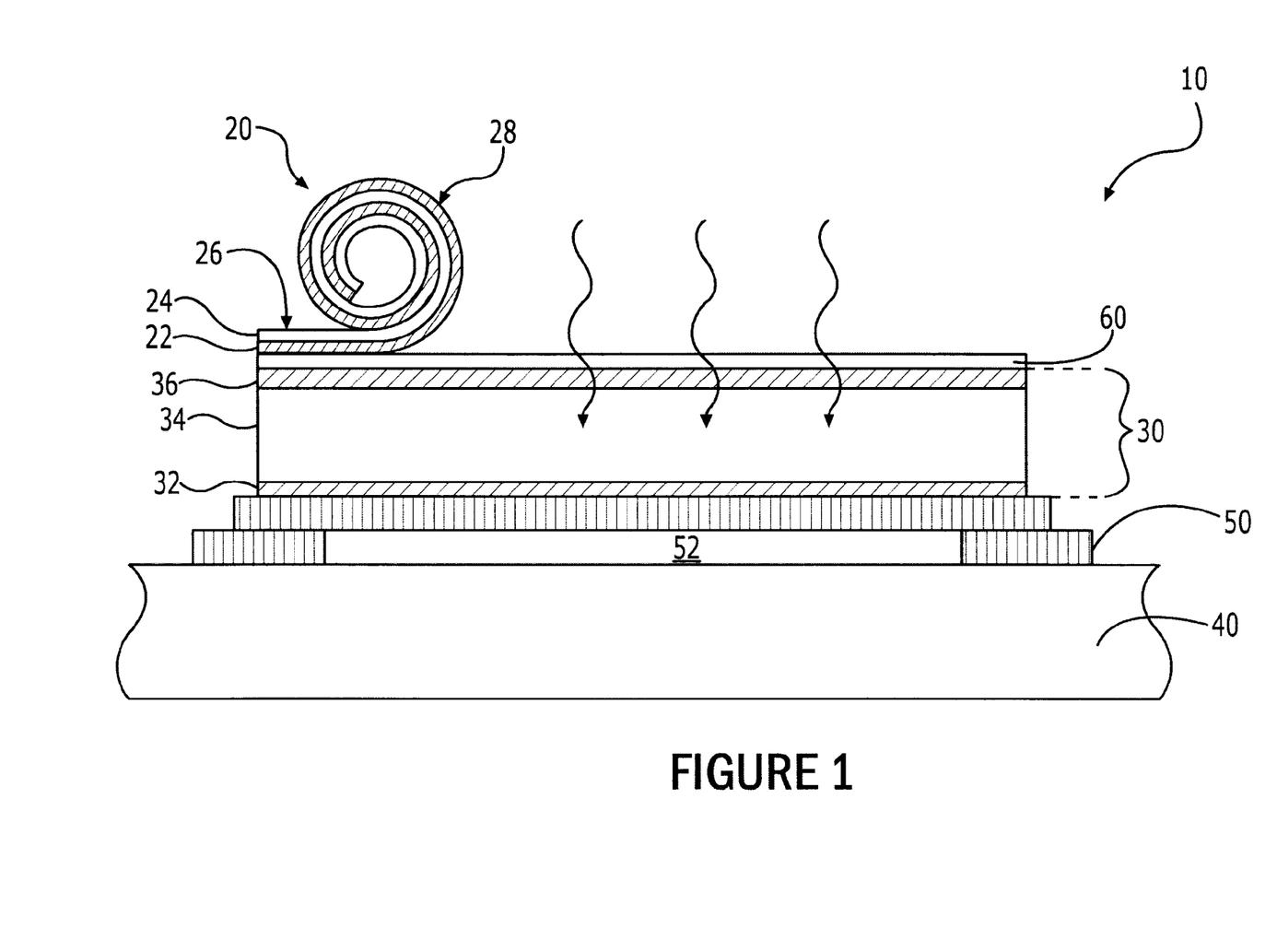
FIG. 1 is a cross-sectional view of an electromagnetic radiation detector having an electrostatically driven MEMS chopper device in the open state, in accordance with an embodiment of the present invention.
Figure 2:
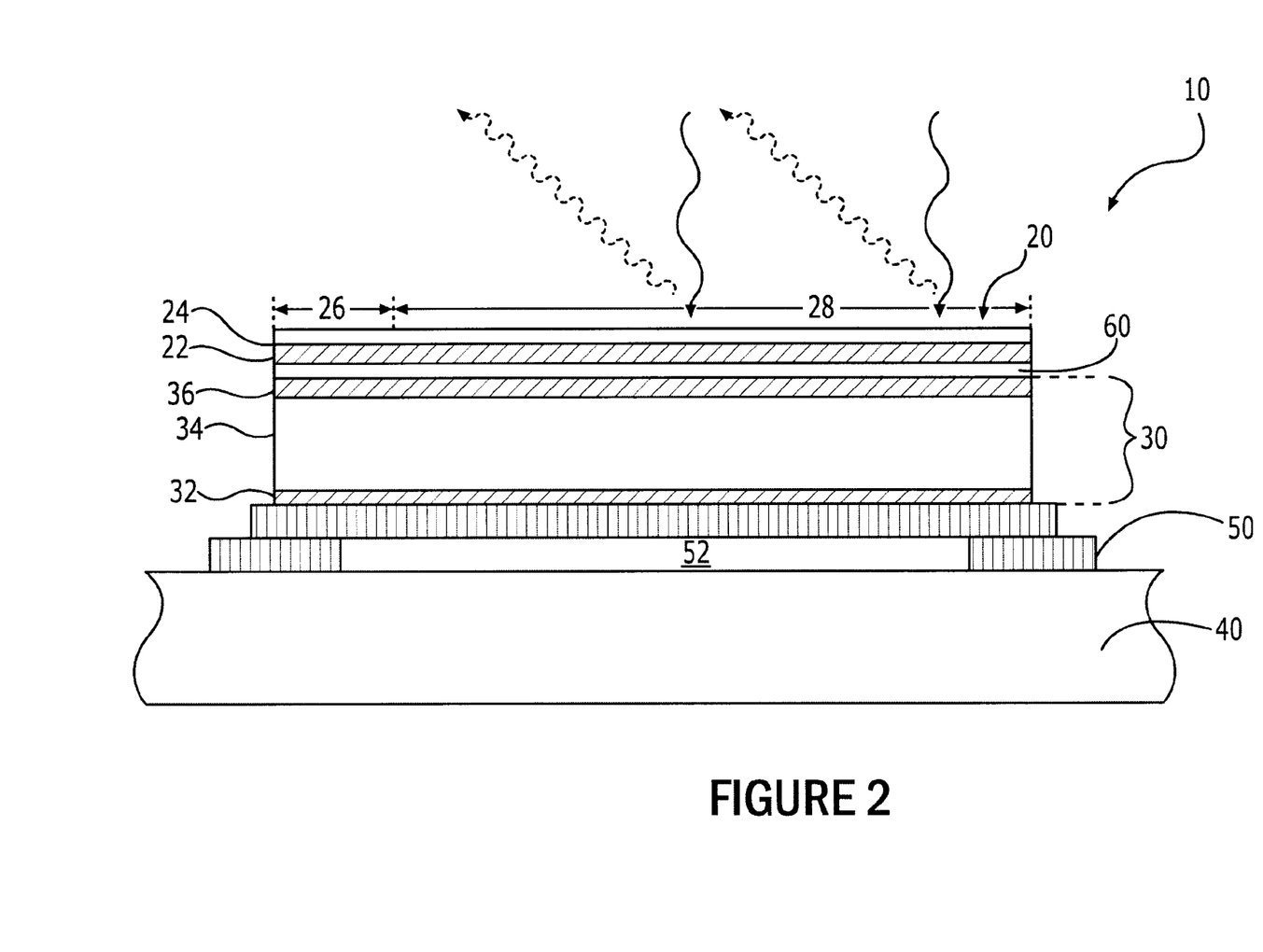
FIG. 2 is a cross-sectional view of an electromagnetic radiation detector having an electrostatically driven MEMS chopper device in the closed state, in accordance with an embodiment of the present invention.

Referring to FIGS. 1 and 2, in accordance with the present invention an electromagnetic radiation detector having an electrostatically driven MEMS radiation chopper device 10 is depicted in cross-section in open and closed states. In this embodiment the flexible film actuator 20 is fabricated directly on the detector 30. It will be understood by those having ordinary skill in the art that when a layer or element is described herein as being "on" another layer or element, it may be formed directly on the layer, at the top, bottom or side surface area, or one or more intervening layers may be provided between the layers.

In FIG. 1, the chopper device is shown in the open state, in which the flexible film actuator 20 is depicted in a curled position (i.e. open state) that allows electromagnetic radiation, typically infrared radiation, to pass through to the detector 30. In FIG. 2, the chopper device is shown in a closed state, in which the flexible film actuator 20 is depicted in an uncurled position (i.e. closed state) that blocks radiation from passing through to the detector 30. The chopper device moves from the open to closed states by applying an electrostatic force between an electrode in the flexible film actuator and an associated fixed electrode that underlies the flexible film actuator. Typically, in the absence of electrostatic force the flexible film actuator will be positioned in the open state and application of electrostatic force will result in the flexible film be positioned in the closed state.

In accordance with the present invention, the electromagnetic radiation detector having an electrostatically driven MEMS radiation chopper device 10 will comprise a detector device 30 that will be sensitive to electromagnetic radiation exposure. The detector device may include a pyroelectric detector, a thermal microbolometer, a dielectric microbolometer or any other detector or sensing device that is sensitive to electromagnetic radiation exposure. In the embodiment shown in FIGS. 1 and 2, the detector comprises a first electrode element 32, a detector material element 34, and a second electrode element 36. The first and second electrode elements will be in electrical contact with the detector element and will be electrically isolated from one another. As shown, the detector material element is formed as a layer that is positioned between the first and second electrode elements that are also formed as layers, however; it is also possible, and within the inventive concepts herein disclosed, to configure the detector element and electrode elements in other suitable arrangements that facilitate electrode contact with the detector element and electrical isolation amongst the electrodes. The first and second electrode elements may comprise gold, platinum, titanium, chromium, ruthenium oxide ($RuO_2$), lanthanum strontium cobalt oxide (LSCO) or other electrically conducting material.

The detector device 30 will typically be supported by a substrate 40, preferably a microelectronic substrate, such as a silicon substrate embodying a CMOS-type (Complementary Metal-Oxide Silicon) read-out circuit. It should be noted that while most embodiments of the invention will include a substrate that supports the detector device it is also possible, and within the inventive concepts herein disclosed to have the detector device free-standing and/or remote from an underlying or supporting substrate.

Additionally, the electromagnetic detector having an electrostatically driven MEMS radiation chopper device will comprise a flexible film actuator 20. The flexible film actuator will typically include an electrode element and at least one biasing element. In the embodiment shown in FIGS. 1 and 2, the flexible film actuator comprises an electrode layer 22 and a biasing layer 24. In alternate embodiments of the invention, the flexible film actuator may include other combinations of biasing layers and electrode layers, such as an electrode layer positioned between two biasing layers. The flexible film actuator will typically have a fixed portion 26 that is attached to the underlying surface and a distal portion 28 that is released from the underlying surface during fabrication and is moveable with respect to an underlying electrode. In the embodiment shown the distal portion is represented by the curled portion of the flexible film. The curl in the film is typically imparted during fabrication and is generally induced by thermal or mechanical stresses imparted during processing. The flexible film actuator will be positioned such that it generally overlies the entirety of the detector element when the actuator is positioned in the closed state.

Actuator motion is produced by an applied electrostatic field between the electrode in the distal portion of the flexible film actuator and a fixed electrode in the underlying construct. In the embodiment shown in FIGS. 1 and 2, in which the flexible film actuator is fabricated directly on top of the detectors the fixed electrode used for electrostatic actuation may be the second electrode element 36 of the detector 30 or, alternatively, a separate fixed electrode may be formed in the construct as a distinct layer. If a separate fixed electrode layer is formed in the construct it will typically be electrically isolated from the electrode elements of the detector by some form of insulation, typically an insulation layer disposed between the fixed electrode and the electrode element of the detector. In addition, if a separate fixed electrode is formed it must also be transparent to the electromagnetic radiation being detected. The transparent electrode may include a conducting oxide material, such as lanthanum strontium cobalt oxide (LSCO) or nickel cobalt oxide ($NiCo_2O_4$).

Additionally, the electromagnetic radiation detector having an electrostatically driven MEMS radiation chopper device will be fabricated on a radiation detector that typically will include a thermal isolation bridge 50 that serves to alleviate thermal effects migrating from the detector 30 to the circuitry in the substrate 40. The thermal isolation bridge will typically be formed so as to provide for an air gap 52 between the detector and the substrate. Standard MEMS fabrication techniques, typically employing release layer processing, are used to form the thermal isolation bridge and the resulting air gap. An exemplary thermal isolation bridge will have a thickness of about 1000 to about 5000 angstroms and be formed of a suitable nitride, such as silicon nitride or the like.

The electromagnetic radiation detector having an electrostatically driven MEMS radiation chopper device may also include a radiation absorbing layer 60 that provides radiation-absorbing capabilities to facilitate the passage of radiation to the detector element as thermal energy. In the embodiment shown in FIGS. 1 and 2, the radiation-absorbing layer 60 is formed as a layer disposed on the second electrode element 36. In a typical embodiment the absorbing layer will have a thickness of about 1.0 to about 2.0 micrometers and may comprise a black or absorbing polymer material, carbon black, nickel alloy or gold black.

The detector 30 of the present invention may embody any detector or sensing device that is sensitive to electromagnetic radiation. For instance, the detector may be embodied in an uncooled infrared detector, such as a pyroelectric detector or a thermal microbolometer or the like. In a typical embodiment the detector will be sensitive to long wave infrared (IR) radiation that characteristically exists in the about 8 to about 12 micrometer wavelength range. In a pyroelectric detector the detecting material layer 34 will comprise a ferroelectric material, such as lead zirconate titanate (PZT), lithium tantalate ($LiTaO_3$), lanthanum doped lead titanium oxide ($PbTiO_3$), barium strontium titanate (BST), polyvinylidenefluoride (PVDF) or the like. In a pyroelectric detector the flexible film actuator is pulsed (i.e., rapidly changed from open and closed states) to generate a temperature change in the ferroelectric material. As is known by those with ordinary skill in the art, a pyroelectric detector functions as a ferroelectric capacitor with the capacitor dielectric being spontaneously polarized when the temperature is below the Curie temperature. Since the degree of polarization in pyroelectric material changes with temperature below the Curie point, the voltage across the capacitor changes as the temperature changes. This change in voltage provides a pyroelectric read-out current to circuitry typically located on the substrate 40.

In a thermal microbolometer the detecting material layer 34 will comprise a metal oxide that is used as a resistor. The metal oxide will characteristically have a high rate of change of resistance with temperature. For example, the detecting material layer 34 may comprise vanadium oxide ($VO_x$, where subscript x may be equal to 2 or represent some other stoichiometry) or a similar metal oxide or semiconductor. While these types of detectors do not typically employ the use of a radiation chopping mechanisms the implementation of the chopping device of the present invention may provide a reduction in thermal drift, a decrease in signal noise and an increase in sensitivity of the detector.

As previously discussed, the flexible film actuator 20 will generally comprise multiple layers including at least one electrode layer 22 and one or more biasing layers 24. The number of layers, thickness of layers, arrangement of layers, and choice of materials used may be selected to effect the degree of curl in the flexible film composite. In the preferred embodiment the flexible film actuator will be curled to the greatest degree possible so as to maximize the exposed region of the underlying detector when the actuator is in an open state. The layers are arranged and shown vertically, while the fixed and distal portions are disposed horizontally along the flexible film actuator. The distal portion (i.e., the curled portion) of the flexible film actuator is released from the underlying surface by employing conventional release layer processing during fabrication.

The electrode layer 22 of the flexible film actuator will comprise a flexible conductor material, such as gold, although other acid tolerant (for release layer processing purposes) conductors such as conductive polymer film may be used. The electrode element also serves to deflect the electromagnetic radiation when the actuator is uncurled or closed. While the plan view configuration of the overall flexible film actuator will generally mirror the plan view configuration of the underlying detector, the surface area or configuration of the electrode layer 22 can be varied as required to create the desired electrostatic force or varied as a function of the distance from the fixed portion.

It should be noted that in applications in which the flexible electrode layer 24 or the first and second electrode layers 32 and 36 of the detector are formed of gold it may be necessary to deposit a thin layer of chromium onto the flexible electrode layer or the first and second electrode layers to promote adhesion for the subsequently formed layer(s).

The biasing element will typically comprise polyimide, although other flexible polymers suitable for release layer processing may also be used to form the biasing layer. As shown in FIGS. 1 and 2, the minimal configuration of the flexible film actuator will include two layers; one layer biasing layer 24, and one layer of flexible electrode 26. Alternatively embodiments may include additional biasing elements/layers and or additional electrode elements/layers. One such embodiment will include an electrode layer deposited between two biasing layers (i.e., biasing layer/electrode layer/biasing layer).

Different thermal coefficients of expansion between the biasing layer and the electrode layer will bias the distal portion 28 of the actuator to curl away from the underlying surface after removal of the release layer. Additionally, other techniques may be used to curl the flexible film actuator. For example, different deposition process steps can be used to create intrinsic stresses so as to curl the layers comprising the flexible film actuator. Further, the flexible film can be curled by creating intrinsic mechanical stresses in the layers included therein. In addition, sequential temperature changes during processing can be used to curl the flexible film. For instance, the polymeric biasing film can be deposited as a liquid and then cured at elevated temperatures so that it forms a solid polymer layer. Preferably, a polymer having a higher thermal coefficient of expansion than the electrode layer can be used. Next, the polymer layer and electrode layer are cooled, creating stresses due to differences in the thermal coefficients of expansion. The overall flexible film curls because the polymeric biasing layer shrinks faster than the electrode layer.

Figure 3:
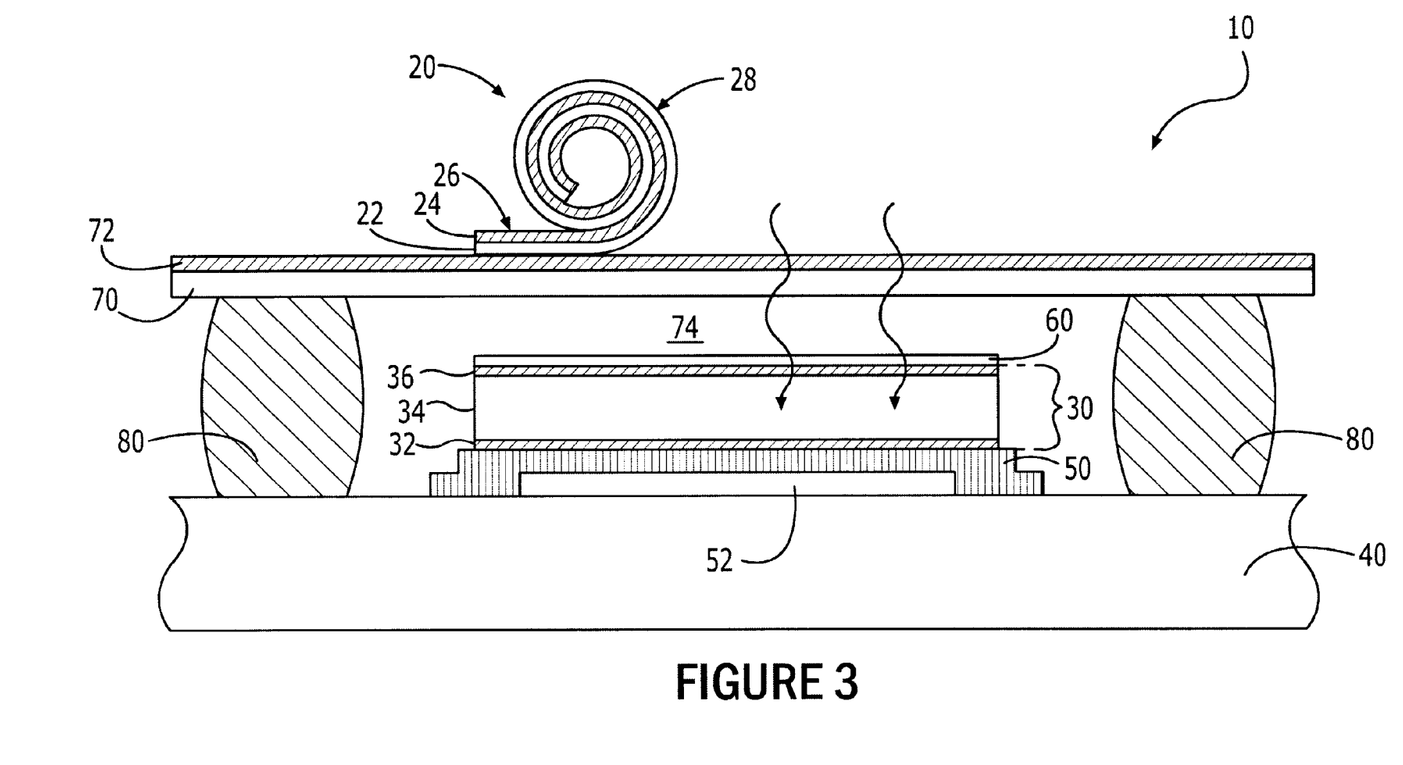
FIG. 3 is a cross-sectional view of an electromagnetic radiation detector having an electrostatically driven MEMS chopper device in the closed state having the flexible film actuator formed on a second substrate, in accordance with an alternate embodiment of the present invention.
Figure 4:
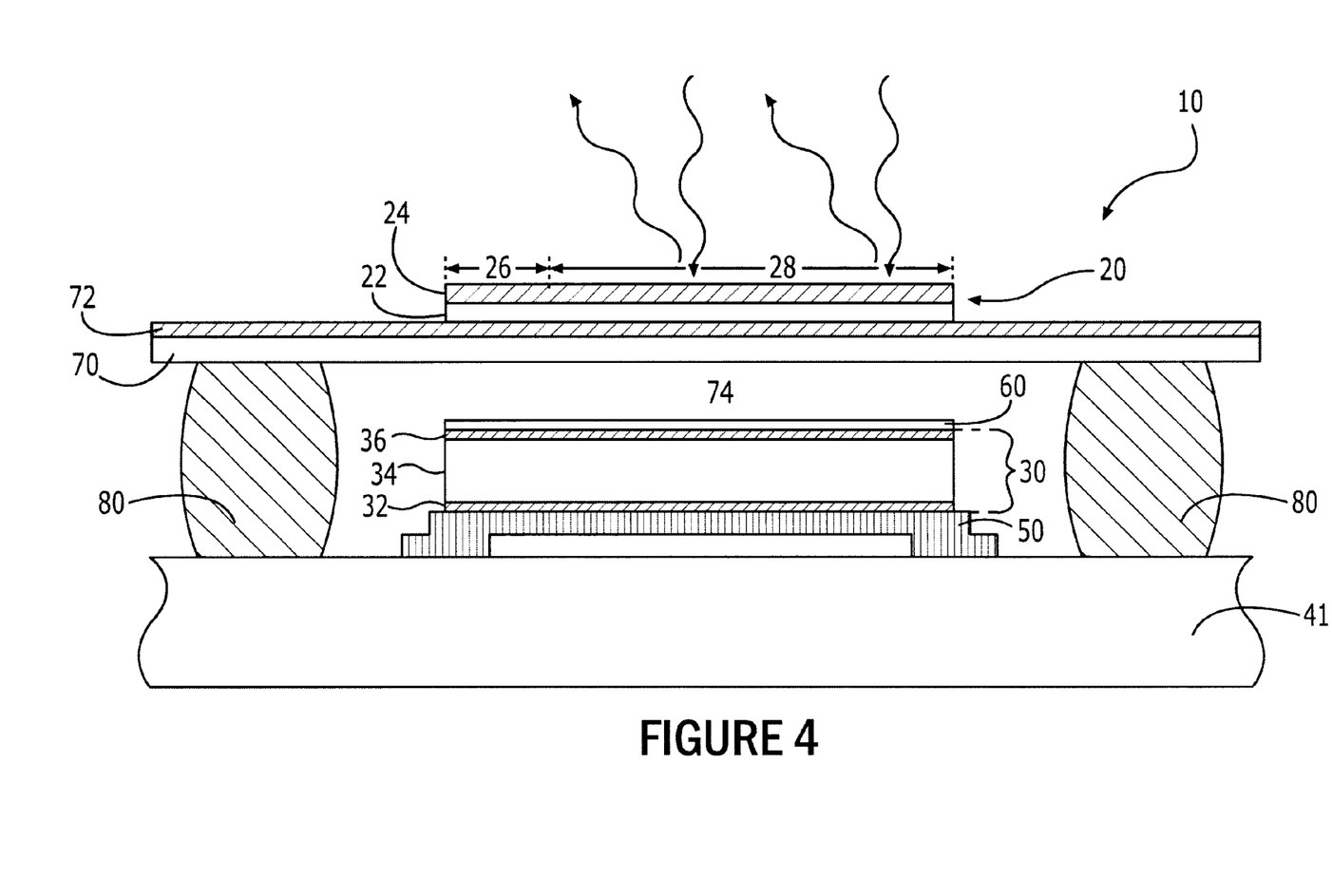
FIG. 4 is a cross-sectional view of an electromagnetic radiation detector having an electrostatically driven MEMS chopper device in the open state having the flexible film actuator formed on a second substrate, in accordance with an alternate embodiment of the present invention.

FIGS. 3 and 4, illustrate cross-sectional views of an alternate embodiment of the present invention. In this embodiment of the electromagnetic radiation detector having an electrostatically driven MEMS chopper device 10, the flexible film actuator 20 is supported by and attached to an second substrate 70 that is generally raised in relation to the underlying detector device. FIG. 3 illustrates the flexible film actuator in the open state in which radiation is allowed to pass and be absorbed into the underlying detector. Alternately, FIG. 4 illustrates the flexible film actuator in the closed state in which incoming radiation is reflected off the surface of extended surface of the actuator. The second substrate is typically formed of a material that is transparent to the electromagnetic radiation that is being detected. In applications in which IR radiation is being detected the second substrate may comprise germanium (Ge), zinc sulfide (ZnS), zinc selenide (ZnSe) or a similar IR transparent substrate material. The second substrate will have a fixed transparent electrode element 72 disposed thereon to provide, in conjunction with the electrode element of the flexible film, electrostatic voltage to the flexible film actuator. In applications in which IR radiation is being detected the transparent electrode may comprise a conductive oxide material, such as lanthanum strontium cobalt oxide (LSCO), nickel cobalt oxide ($NiCo_2O_4$) or the like.

By providing for an additional second substrate that has the flexible film actuator disposed thereon, signal interference between the actuator drive voltage and the detector output signal is significantly reduced. This signal interference reduction is attributed to the insulating characteristics of the second substrate 70 and the air gap 74 that is provided for between the second substrate and the detector 30. In a typical chopper device embodying an second substrate the air gap between the second substrate and the detector will be on the order of about 10 to about 1000 micrometers.

The second substrate 70 is supported by the underlying substrate 40 via support structures 80. Additionally, the support structures serve to elevate the second substrate and associated flexible film actuator above the detector device 30. In a typical embodiment, the support structures may be formed from solder bumps, epoxy structures or any other suitable structure capable of supporting the second substrate.

Figure 5:
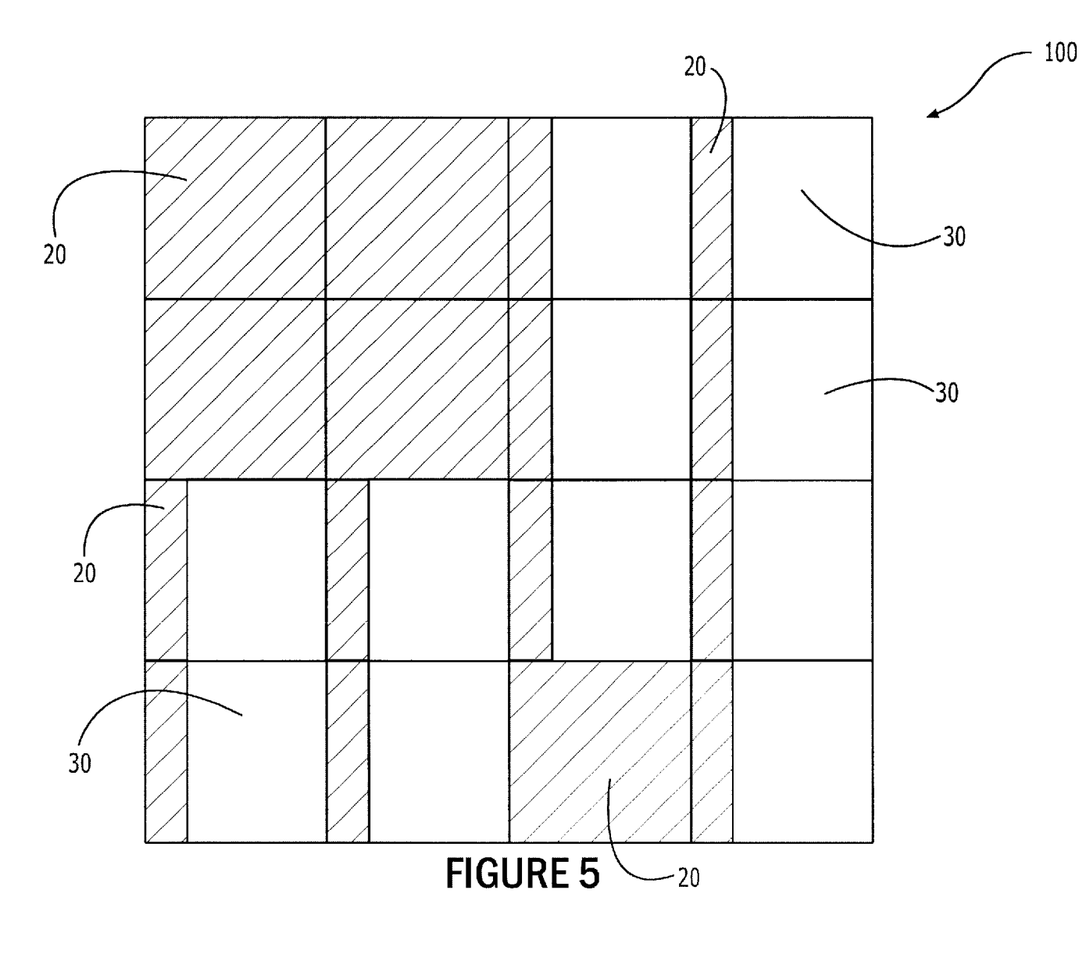
FIG. 5 is a plan view of an electrostatically driven MEMS chopper device array with an underlying focal plane array of electromagnetic radiation detectors in which the individual actuators are associated with individual detectors, in accordance with an embodiment of the present invention.

In accordance with a further embodiment of the present invention, the electrostatically driven MEMS chopper devices are arranged in an array 100 that correspond to an underlying focal plane array (FPA) of detectors. FIG. 5, is a plan view depiction of a 4×4 array of chopper devices in which each flexible flap actuator 20 of the chopper device corresponds to an individual underlying detector 30 in a 4×4 array of detectors (i.e., pixels). The four flexible film actuators in the upper left-hand corner, as well as a fifth flexible film actuator near the bottom right-band corner, are depicted as being in the uncurled closed state. In the uncurled closed state the flexible film actuators block passage of electromagnetic radiation to the underlying detectors. The remaining flexible film actuators 20 in the array are depicted as being in the curled open state. In the curled open state the actuators allow passage of electromagnetic radiation to the underlying detector.

This type of chopper device array configuration (i.e., 1:1 ratio flexible film actuator to underlying detector) is highly desirable, in that, it provides for radiation modulation of each individual detector/pixel in the array independent of the other detectors/pixels in the array. In this configuration the closed choppers would result in detectors closed off from electromagnetic radiation. The closed-off detectors could be referenced as the background temperature to subtract any noise or temperature fluctuations occurring in the overall FPA. The 1:1 ratio actuator to detector/pixel array is most applicable in applications in which the detector/pixel has a surface area larger than about 100×100 micrometers. This scheme provides a means of noise reduction and compensation for temperature fluctuations in the overall FPA. Additionally, if a "hot spot" (i.e. an area of constant brightness) is detected in an imaging array, this area can be closed independently of the remaining detectors/pixels to zero out the temperature spike in this area. As previously discussed other electromagnetic radiation detectors, besides pyroelectric detectors, that do not typically employ the use of chopping devices may benefit from the noise reduction and increased sensitivity that is imparted by the chopping device of the present invention. Such detectors would include, but are not limited to, thermal microbolometers and the like.

Figure 6:
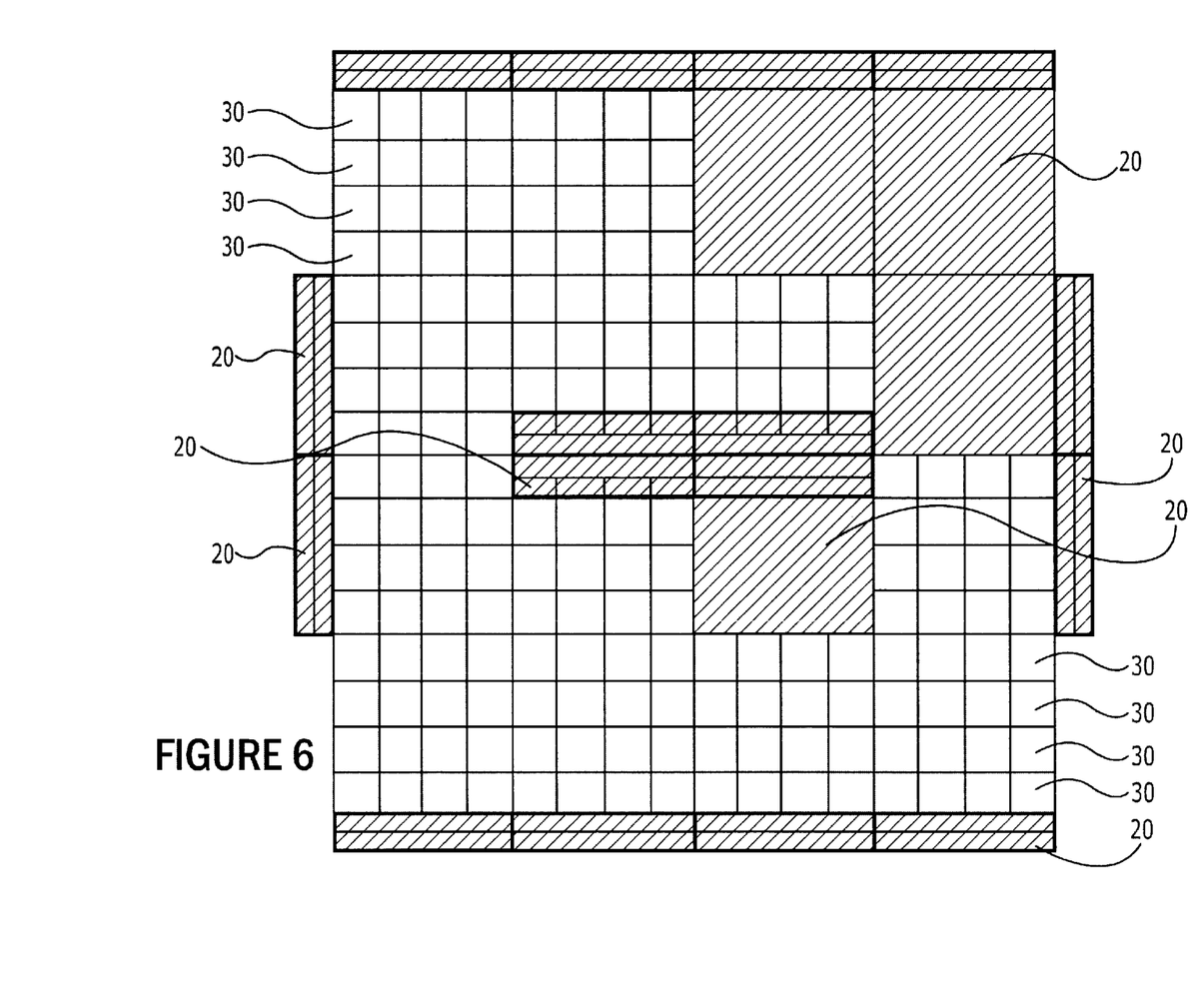
FIG. 6 is a plan view of an electrostatically driven MEMS chopper array with an underlying focal plane array of electromagnetic radiation detectors in which actuators are associated with a plurality of detectors, in accordance with an embodiment of the present invention.

FIG. 6 is an alternate embodiment of an array configuration, in accordance with the present invention. In this array 100 embodiment each flexible film actuator 20 is associated with a grouping of underlying detectors 30. For example, each flexible film actuator will provide chopping capabilities to a 4×4 matrix (i.e. 16 total underlying detectors/pixels). This type of array configuration is desirable in those applications that have FPA detectors/pixels of such small surface area that a 1:1 actuator to detector/pixel ratio would not be feasible. Typically, the type of array shown in FIG. 6 would be conducive to detector/pixels having leas than about 100×100 micrometer surface area. In this embodiment flexible film actuators having larger surface area are implemented, some of which are anchored along the periphery of the underlying FPA of detectors. As shown, four of the flexible film actuators are mounted inside the boundary of the underlying detector array; however, the overall fill factor is still greater than 90 percent. Alternatively, actuators with longer distal portions could be used such that all of the actuators are mounted on the periphery of the detector array.

It should be noted that the configurations of the array of electrostatically driven MEMS radiation chopper devices shown in FIGS. 5 and 6 are by way of example only. Other configurations of arrays, suitable and beneficial to the associated detector array, are also feasible and within the inventive concepts herein disclosed. For example, FIG. 6 shows a detector array of 16×16 pixel/detector elements; however, the chopper device of the present invention may be used for larger arrays with similar schemes. A typical IR imaging FPA will include 320×240 pixel/detector elements.

Figure 7:
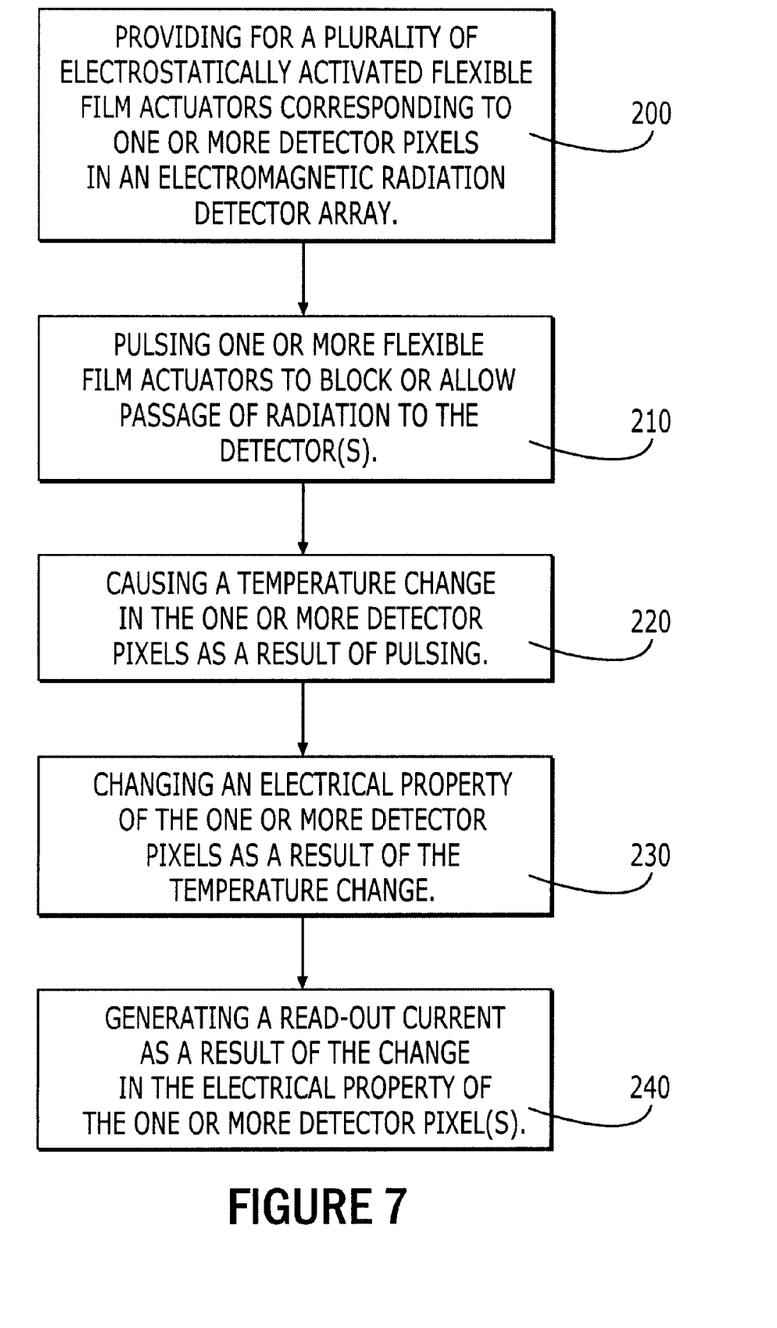
FIG. 7 is a flow diagram of a method for pixel modulation in an electromagnetic radiation imaging focal plane array, in accordance with an embodiment of the present invention.

FIG. 7 is a flow diagram detailing a method for detector/ pixel modulation in a radiation imaging focal plane array, in accordance with an embodiment of the present invention. At step 200, a plurality of electrostatically activated flexible film actuators is provided for with each actuator corresponding to one or more detectors in a focal plane array. The flexible film actuators will typically be disposed about the focal plane array of detectors such that one flexible film actuator is associated with one detector/pixel in the array or, alternatively, one flexible film actuator is associated with a plurality of detectors/pixels within the array. At step 210, one or more of the actuators is pulsed to block the passage of electromagnetic radiation to the one or more underlying detectors. Pulsing involves providing electrostatic voltage to the actuator to cause it move from an open state to a closed state and, subsequently, releasing the voltage to move the actuator from the closed state to the open state. Rapid activation and deactivation of the actuator from the closed state to the open state results in pulsing of the chopper device.

At step 220, the pulsing of the chopper device results in a temperature change in the one or more detectors/pixels associated with the actuators being pulsed. The detectors will typically comprise a temperature sensitive pyroelectric or bolometer material such as PZT, (Pb, La)TiO$_3$, LiTaO$_3$, BST, PVDF or the like. At 230, the change in temperature induced in the detector material will result in a change in polarization, resistance or capacitance or other material related electrical property. The property that changes will be related to the material chosen to form the detector, typical pyroelectric detectors will incur a change in polarization and thermal bolometers will incur a change in resistance. Once the property change occurs, at step 240, a read-out current is generated and is relayed to the read-out circuitry typically disposed in the underlying substrate.

Figure 8A:
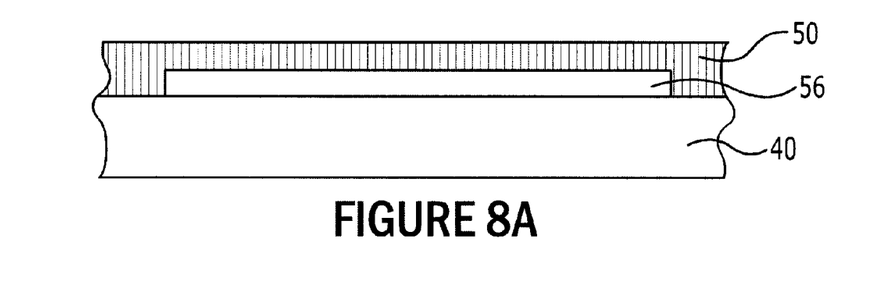
FIGS. 8A–8D are cross-sectional views of various stages in the fabrication process of the electrostatically driven MEMS chopper device, in accordance with an embodiment of the present invention.

FIGS. 8A–8D illustrate cross-sectional views of various stages in the fabrication process of the electromagnetic radiation detector having an electrostatically activated MEMS chopper device, in accordance with an embodiment of the present invention. FIG. 8A illustrates the initial stages of the detector construct in which the substrate 40 has deposited thereon a first sacrificial layer 56 that has been patterned and etched to define the region that will eventually become the air gap 52. Deposited on the first sacrificial layer is a thermal isolation bridge layer 50. The substrate is typically a microelectronic substrate, such as silicon or the like and may embody the signal detection circuitry for the detector. The first sacrificial layer is typically disposed on the substrate using conventional MEMS fabrication techniques, such as evaporation, sputtering or the like and may comprise an oxide, such as silicon oxide or a metal material. Conventional photoresist processing is typically employed to define and etch the regions that will become the legs of the thermal isolation bridge. The thermal isolation bridge layer is characteristically deposited on the sacrificial layer using a standard fabrication process, such as an evaporation procedure and may comprise a nitride, such as silicon nitride or a metal material.

Figure 8B:
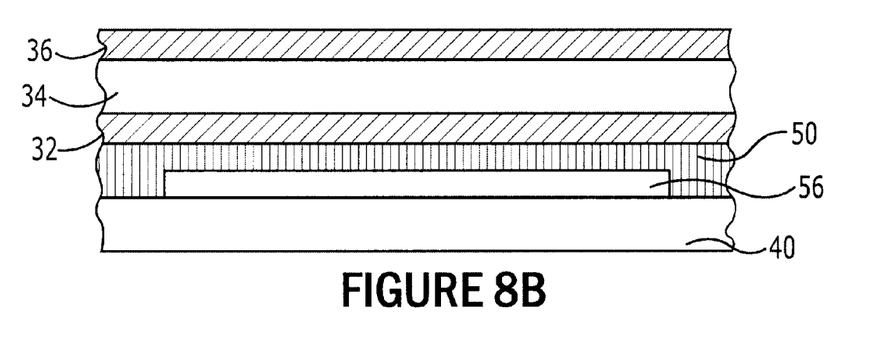

FIG. 8B illustrates the fabrication process after the detector pixel has been formed on the substrate. The detector pixel comprises a first electrode layer 32, a detector material layer 34 and a second electrode layer 34. The first and second electrode layers are deposited using conventional semiconductor fabrication techniques, such as evaporation, sputtering or the like and may comprise gold, platinum, chromium, titanium, LSCO, ruthenium oxide or any other suitable electrode material. The detector material layer is disposed using conventional fabrication techniques such as evaporation, sputtering or, if the detector material layer comprises a sol-gel material, spin coat processing. The detector material layer may comprise lead zirconate titanate (PZT), lithium tantalate (LiTaO$_3$), lead titanium oxide (PbTiO$_3$), barium strontium titanate (BST), polyvinylidene fluoride (PVDF), vanadium oxide or any other suitable detector material may be used to form the detector. Additionally, an electromagnetic radiation absorbing material layer (not shown in FIG. 8) may be disposed on the second electrode layer to facilitate the passage of radiation to the detector element as thermal energy. The absorbing material layer may comprise a black or absorbing polymer material, carbon black, nickel alloy, gold black or another suitable material.

Figure 8C:
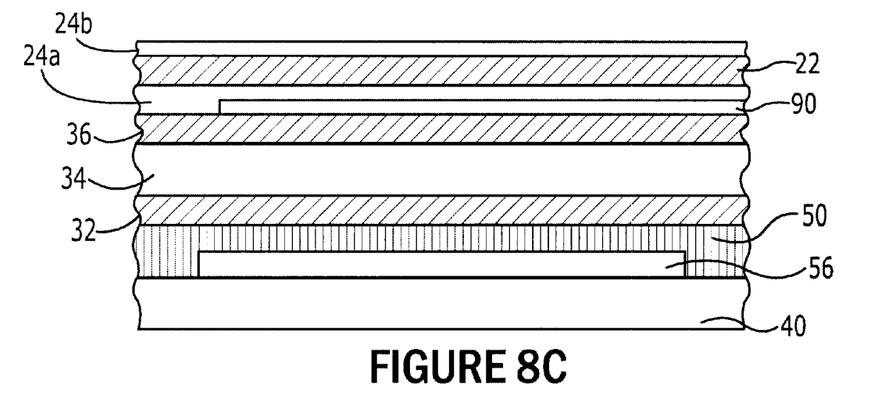

FIG. 8C depicts the fabrication process after the flexible film actuator has been disposed on the substrate. Prior to depositing the flexible film actuator 20 on the detector construct a second sacrificial layer 90 is deposited on the second electrode layer. The second sacrificial layer is typically disposed on the substrate using conventional MEMS fabrication techniques, such as evaporation, sputtering or the like and may comprise an oxide, such as silicon oxide or a metal material. Conventional photoresist processing is typically employed to define and etch the regions that will become the points of attachment for the fixed portion of the flexible film actuator. As shown, the flexible film actuator may comprise an electrode element 22 and first and second biasing elements 24a and 24b. The first and second biasing elements typically comprise a flexible polymeric material, such as polyimide or the like and will generally be deposited as layers using conventional fabrication techniques, such as evaporation, sputtering, spin coating or the like. The electrode element of the flexible film actuator typically comprises a flexible conductive material, such as gold or a conductive polymer and will generally be deposited as layers using conventional fabrication techniques, such as evaporation, sputtering or the like.

Figure 8D:
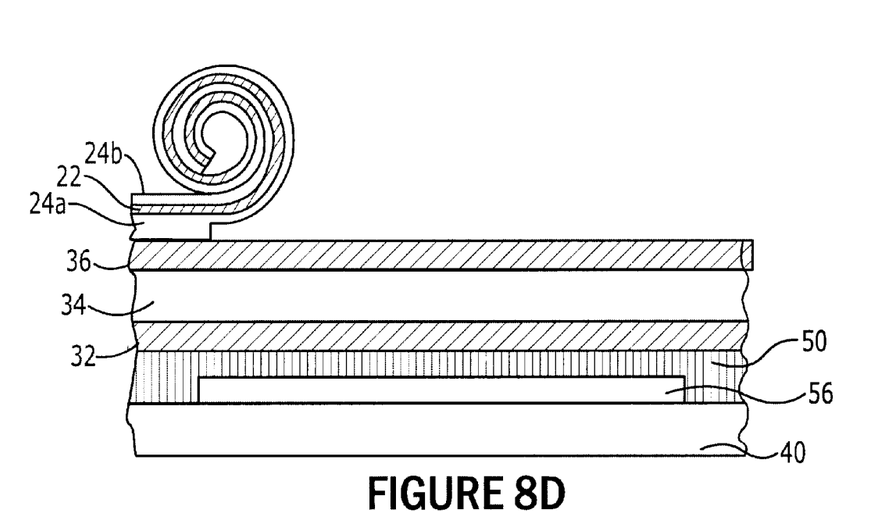

FIG. 8D illustrates completed fabrication of the electromagnetic radiation detector having an electrostatically activated MEMS chopper device. The first and second sacrificial layers have been removed, typically by exposing the device to an acid solution. Removal of the first sacrificial layer provides for the air gap 52 located between the thermal isolation bridge 50 and the substrate 50. Removal of the second sacrificial layer provides for the release if the distal portion of the flexible film actuator.

Accordingly, the present invention provides for an improved electromagnetic radiation detector having an electrostatically activated chopping device that will leverage the simplified MEMS fabrication techniques with the advantages of individual chopper/actuator design. Such a design will additionally provide the detector with signal noise reduction, sensitivity modulation, compensation for temperature fluctuations and temperature referencing capabilities.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limiting the scope of the present invention in any way.

That which is claimed:

1. An electromagnetic radiation detector having an electrostatically driven microelectromechanical system (MEMS) chopper device, comprising:
    a detector material element;
    first and second electrodes in electrical contact with said detector material element; and
    a flexible film actuator overlying said detector material element and moveable relative thereto to alternately allow passage of electromagnetic radiation to said detector material element and block passage of radiation to said detector material element.

2. The detector of claim 1, further comprising a substrate that supports the detector material element.

3. The detector of claim 2, wherein the substrate further comprises a silicon substrate having a read-out circuit disposed thereon.

4. The detector of claim 2, further comprising a thermal isolation bridge disposed on the substrate that supports the dielectric material element and provides thermal isolation between the detector material layer and the substrate.

5. The detector of claim 2, wherein the detector material element further comprises a detector material layer and the first and second electrodes further comprise first and second electrode layers disposed on opposite sides of the detector material layer and supported by the substrate.

6. The detector of claim 1, wherein the flexible film actuator further comprises a third electrode and a biasing element, the actuator having a fixed portion attached to an underlying surface and a distal portion moveable relative to an underlying electrode.

7. The detector of claim 6, further comprising a fourth electrode disposed between the flexible film actuator and the second electrode, the distal portion of the actuator being moveable relative to the fourth electrode.

8. The detector of claim 7, further comprising an insulating element disposed between the fourth electrode and the first and second electrodes.

9. The detector of claim 1, further comprising an electromagnetic radiation-absorbing element disposed between the detector material element and the flexible film actuator.

10. The detector of claim 1, wherein the detector material element further comprises a detector material chosen from the group consisting of lead zirconate titanate (PZT), lithium tantalate ($LiTaO_3$), lead titanium oxide ($PbTiO_3$), barium strontium titanate (BST), polyvinylidene fluoride (PVDF) and vanadium oxide.

11. The detector of claim 1, further comprising a transparent substrate disposed proximate the detector material element and a transparent electrode disposed on the transparent substrate, wherein the flexible film actuator is supported by and affixed to said transparent substrate.

12. The detector of claim 11, further comprising an air gap separating the detector material element from the transparent substrate.

13. An electromagnetic radiation detector having an electrostatically driven MEMS chopper device, comprising:
    a substrate;
    a thermal isolation bridge disposed on said substrate;
    a first electrode layer disposed on said thermal isolation bridge;
    a detector material layer overlying on said thermal isolation bridge and in electrical contact with said first electrode layer;
    a second electrode layer overlying said thermal isolation bridge, electrically isolated from said first electrode layer and in electrical contact with said detector material layer; and
    a flexible film actuator overlying the detector material layer and having a third electrode layer and at least one biasing layer, the actuator having a fixed portion attached to an underlying surface and a distal portion movable with respect to the second electrode layer.

14. The detector of claim 13, wherein said substrate further comprises a read-out circuit disposed on the substrate.

15. The detector of claim 13, further comprising an air gap between the substrate and the detector material layer.

16. The detector of claim 13, wherein the detector material layer is disposed between the first electrode layer and the second electrode layer.

17. The detector of claim 13, wherein the first and second electrode layers further comprise a material chosen from the group consisting of gold, platinum, chromium, titanium, LSCO or ruthenium oxide.

18. The detector of claim 13, wherein the detector material layer further comprises a detector material chosen from the group consisting of lead zirconate titanate (PZT), lithium tantalate ($LiTaO_3$), lead titanium oxide ($PbTiO_3$), barium strontium titanate (BST), polyvinylidene fluoride (PVDF) and vanadium oxide.

19. The detector of claim 13, further comprising an electromagnetic radiation-absorbing layer disposed between said second electrode layer and said flexible film actuator.

20. The detector of claim 13, wherein the flexible film actuator device further comprises a third electrode layer disposed between a first biasing layer and a second biasing layer.

21. The detector of claim 13, further comprising an insulating layer disposed on the electromagnetic radiation-absorbing layer.

22. The detector of claim 21, further comprising a fourth electrode layer disposed on the insulating layer, wherein the distal portion of the flexible film actuator is moveable with respect to the fourth electrode layer.

23. An electromagnetic radiation detector having an electrostatically driven MEMS chopper device, comprising:
    a substrate;
    a thermal isolation bridge disposed on said substrate;
    a first electrode layer disposed on said thermal isolation bridge;
    a detector material layer overlying on said thermal isolation bridge and in electrical contact with said first electrode layer;
    a second electrode layer overlying said thermal isolation bridge, electrically isolated from said first electrode layer and in electrical contact with said detector material layer;
    a support structure disposed on the substrate;
    a transparent substrate attached to the support structure;
    a transparent third electrode layer disposed on the transparent substrate; and
    a flexible film actuator overlying the transparent third electrode and the detector material layer, the flexible film actuator having a fourth electrode layer and at least one biasing layer, a fixed portion attached to the transparent substrate and a distal portion movable with respect to the third electrode layer.

24. The detector of claim 23, wherein said substrate further comprises a read-out circuit disposed on the substrate.

25. The detector of claim 23, further comprising a first air gap between the substrate and the detector material layer.

26. The detector of claim 25, further comprising a second air gap between the transparent substrate and the absorbing layer.

27. The detector of claim 23, wherein the detector material layer is disposed between the first electrode layer and the second electrode layer.

28. The detector of claim 23, wherein the first and second electrode layers further comprise a material from the group consisting of gold, platinum, chromium, titanium, LSCO or ruthenium oxide.

29. The detector of claim 23, wherein the detector material layer further comprises a detector material chosen from the group consisting of lead zirconate titanate (PZT), lithium tantalate (LiTaO$_3$), lead titanium oxide (PbTiO$_3$), barium strontium titanate (BST), polyvinylidene fluoride (PVDF) and vanadium oxide.

30. The detector of claim 23, further comprising a an electromagnetic radiation absorbing layer overlying said first and second electrode layers and said detector material layer.

31. The detector of claim 23, wherein the fourth electrode layer of the flexible film actuator is disposed between a first biasing layer and a second biasing layer.

32. An electromagnetic radiation detector array having an electrostatically driven microelectromechanical system (MEMS) chopper array, comprising:
- a substrate;
- a plurality of detector pixels supported by said substrate, said detector pixels comprising:
  - a detector material layer; and
  - first and second electrodes in electrical contact with said detector material layer; and
- a plurality of flexible film actuators, each actuator overlying said detector material layer of a corresponding detector pixel and moveable relative thereto to alternately allow passage of radiation to said detector material layer and block passage of radiation to said detector material layer.

33. The detector array of claim 32, wherein the substrate further comprises a silicon substrate having a read-out circuit disposed thereon.

34. The detector array of claim 32, further comprising a plurality of thermal isolation bridges disposed on the substrate that support the detector material layer corresponding to a detector pixel and provides thermal isolation between the detector pixel and the substrate.

35. The detector array of claim 32, wherein the plurality of detector pixels further comprises first and second electrodes disposed in layered formation on opposite sides of the detector material layer.

36. The detector array of claim 32, wherein the plurality of flexible film actuators further comprise a third electrode and a biasing element, each actuator having a fixed portion attached to an underlying surface and a distal portion moveable relative to the second electrode of the corresponding detector pixel.

37. The detector array of claim 32, further comprising a radiation-absorbing layer disposed between the plurality of flexible film actuators and the plurality of detector pixels.

38. The detector array of claim 32, wherein the detector material layer further comprises a detector material chosen from the group consisting of lead zirconium titanate (PZT), lithium tantalate (LiTaO$_3$), lead titanium oxide (PbTiO$_3$), barium strontium titanate (BST), polyvinylidene fluoride (PVDF) and vanadium oxide.

39. The detector array of claim 32, further comprising a transparent substrate supported by said substrate and a transparent electrode disposed on the transparent substrate, wherein the plurality of flexible film actuators are supported by and affixed to said transparent substrate and wherein said transparent substrate and transparent electrode are transparent to the electromagnetic radiation being detected.

40. The detector array of claim 39, further comprising an air gap separating the plurality of detector pixels from the transparent substrate.

41. The detector array of claim 39, further comprising a support structure disposed on the substrate for positioning and supporting said transparent substrate.

42. The detector array of claim 39, wherein the support structure further comprises a plurality of solder bumps.

43. The detector array of claim 39, wherein the support structure further comprises at least one epoxy attachment.

44. A method for pixel modulation in an electromagnetic radiation detector array, the method comprising:
- providing for a plurality of electrostatically activated flexible film actuators, each actuator corresponding to one or more detector pixels in an electromagnetic radiation detector array;
- pulsing one or more flexible film actuators to block passage of electromagnetic radiation and to allow passage of electromagnetic radiation to the one or more detector pixels corresponding to the flexible film actuator;
- causing a temperature change in the one or more detector pixels as a result of the pulsing of the corresponding flexible film actuator;
- changing an electrical property of the one or more detector pixels as a result of the temperature change in one or more detector pixels; and
- generating a read-out current as a result of the change in the electrical property of the one or more detector pixels.

45. The method of claim 44, wherein pulsing one or more flexible film actuators further comprises:
- activating, electrostatically, one or more flexible film actuators to block passage of electromagnetic radiation to the corresponding one or more detector pixels; and
- deactivating, by releasing the electrostatic force, one or more flexible film actuators to allow passage of electromagnetic radiation to the corresponding one or more detector pixels.

46. The method of claim 44, wherein changing an electrical property of the one or more detector pixels further comprises changing a property of the one or more detector pixels chosen from the group consisting of polarization, capacitance or resistance.

* * * * *

UNITED STATES PATENT AND TRADEMARK OFFICE
CERTIFICATE OF CORRECTION

PATENT NO. : 6,586,738 B2  Page 1 of 1
DATED : July 1, 2003
INVENTOR(S) : Dausch et al.

It is certified that error appears in the above-identified patent and that said Letters Patent is hereby corrected as shown below:

Column 12,
Line 50, "substrate 50" should read -- substrate 40 --.

Column 14,
Line 39, "claim 13" should read -- claim 19 --.

Column 15,
Line 9, "absorbing" should read -- detector material --.

Signed and Sealed this

Twenty-first Day of October, 2003

JAMES E. ROGAN
*Director of the United States Patent and Trademark Office*